(12) United States Patent
Chen et al.

(10) Patent No.: US 11,012,600 B2
(45) Date of Patent: May 18, 2021

(54) DISPLAY DEVICE AND MANUFACTURING METHOD OF THE SAME

(71) Applicants: Beijing BOE Optoelectronics Technology Co., Ltd., Beijing (CN); BOE Technology Group Co., Ltd., Beijing (CN)

(72) Inventors: Zhiyong Chen, Beijing (CN); Haiwei Sun, Beijing (CN); Jian Sang, Beijing (CN); Zhihui Zeng, Beijing (CN); Zongying Shu, Beijing (CN); Xiangyu Ji, Beijing (CN); Jinpeng Li, Beijing (CN); Wei Gong, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/261,770

(22) Filed: Jan. 30, 2019

(65) Prior Publication Data
US 2019/0253591 A1    Aug. 15, 2019

(30) Foreign Application Priority Data
Feb. 12, 2018 (CN) .......................... 201810147321.2

(51) Int. Cl.
*H04N 5/225* (2006.01)
*G02F 1/1345* (2006.01)
(Continued)

(52) U.S. Cl.
CPC ............. *H04N 5/2257* (2013.01); *G02B 7/04* (2013.01); *G02F 1/1333* (2013.01);
(Continued)

(58) Field of Classification Search
None
See application file for complete search history.

(56) References Cited

U.S. PATENT DOCUMENTS

| 7,528,912 B2 * | 5/2009 | Zhang | ............... G02F 1/133 349/116 |
| 2004/0212555 A1 * | 10/2004 | Falco | ............... H04M 1/0277 345/50 |

(Continued)

FOREIGN PATENT DOCUMENTS

| CN | 201421600 Y | 3/2010 |
| CN | 102854737 A | 1/2013 |
| CN | 105681637 A | 6/2016 |

OTHER PUBLICATIONS

First Office Action, including Search Report, for Chinese Patent Application No. 201810147321.2, dated Jun. 5, 2020, 19 pages.

*Primary Examiner* — Twyler L Haskins
*Assistant Examiner* — Wesley J Chiu
(74) *Attorney, Agent, or Firm* — Westman, Champlin & Koehler, P.A.

(57) ABSTRACT

A display device and a method for manufacturing the display device are provided. The display device includes: a display panel, including a first substrate and a second substrate arranged opposite to the first substrate, wherein the first substrate includes a single-substrate area beyond the second substrate; a display driving circuit electrically connected to the display panel; a lens assembly arranged at the single-substrate area of the first substrate and configured to collect light information; and an image sensor arranged at the single-substrate area of the first substrate, connected to the display driving circuit, and configured to receive the light information collected by the lens assembly.

11 Claims, 4 Drawing Sheets

(51) Int. Cl.
*H01L 27/146* (2006.01)
*H01L 23/00* (2006.01)
*G02B 7/04* (2021.01)
*G02F 1/13357* (2006.01)
*G02F 1/1333* (2006.01)

(52) U.S. Cl.
CPC ........ *G02F 1/1336* (2013.01); *G02F 1/13452* (2013.01); *H01L 24/16* (2013.01); *H01L 24/32* (2013.01); *H01L 27/1462* (2013.01); *H01L 27/1469* (2013.01); *H01L 27/14618* (2013.01); *H01L 27/14625* (2013.01); *H01L 27/14634* (2013.01); *H01L 27/14636* (2013.01); *H01L 27/14685* (2013.01); *H04N 5/2253* (2013.01); *H04N 5/2254* (2013.01); *H01L 2224/16145* (2013.01); *H01L 2224/32145* (2013.01)

(56) References Cited

U.S. PATENT DOCUMENTS

| | | | |
|---|---|---|---|
| 2006/0146230 A1 | 7/2006 | Joon | |
| 2010/0033647 A1* | 2/2010 | Okita | H01L 27/14601 349/57 |
| 2010/0315570 A1* | 12/2010 | Mathew | G06F 1/1601 349/58 |
| 2011/0149139 A1* | 6/2011 | Chang | H04N 5/2257 348/333.08 |
| 2012/0105400 A1* | 5/2012 | Mathew | H04N 5/2257 345/207 |
| 2012/0106063 A1* | 5/2012 | Mathew | G06F 1/1616 361/679.21 |
| 2013/0106813 A1* | 5/2013 | Hotelling | G06F 1/1637 345/207 |
| 2013/0176512 A1* | 7/2013 | Posner | G02F 1/1333 349/33 |
| 2014/0225131 A1* | 8/2014 | Benson | G06F 1/1643 257/82 |
| 2017/0003540 A1* | 1/2017 | Chen | G02F 1/13452 |
| 2017/0123454 A1* | 5/2017 | Evans, V | H04N 5/2258 |
| 2017/0123575 A1* | 5/2017 | Evans, V | G06F 3/041 |
| 2017/0264799 A1* | 9/2017 | Wang | H04N 5/2258 |
| 2018/0190710 A1* | 7/2018 | Ryu | H01L 27/14618 |
| 2019/0260919 A1* | 8/2019 | Kwak | G02F 1/133512 |
| 2019/0331960 A1* | 10/2019 | Li | G02F 1/13318 |

\* cited by examiner

DISPLAY DEVICE AND MANUFACTURING METHOD OF THE SAME

CROSS-REFERENCE TO RELATED APPLICATION

The present application claims a priority of a Chinese patent application No. 201810147321.2 filed in China on Feb. 12, 2018, a disclosure of which is incorporated herein by reference in its entirety.

TECHNICAL FIELD

The present disclosure relates to a field of display technology, and in particular relates to a display device and a method for manufacturing the display device.

BACKGROUND

A camera module of a terminal such as a mobile phone mainly includes a lens assembly and an image processing assembly. With development of science and technology, a terminal with a narrow bezel and a small thickness become a trend. Due to limitation of a size of the camera module, a thickness of a mobile phone cannot be further reduced, and thus, a screen-to-body ratio of a screen of the mobile phone is limited.

SUMMARY

In a first aspect, a display device is provided in the present disclosure and includes: a display panel, including a first substrate and a second substrate arranged opposite to the first substrate, wherein the first substrate includes a single-substrate area beyond the second substrate; a display driving circuit electrically connected to the display panel; a lens assembly arranged at the single-substrate area of the first substrate and configured to collect light information; and an image sensor arranged at the single-substrate area of the first substrate, connected to the display driving circuit, and configured to receive the light information collected by the lens assembly.

Optionally, the first substrate includes a first surface facing towards the second substrate and a second surface opposite to the first surface, the single-substrate area includes a first region, the first region is a transparent region, the lens assembly is arranged on the first surface, and an orthographic projection of the lens assembly onto the first substrate includes the first region or falls within the first region.

Optionally, the first region of the first substrate is provided with a through-hole penetrating through the first surface and the second surface and forming the transparent region; or the first substrate includes a first base substrate and a trace arranged on the first base substrate, and a portion of the first base substrate and a portion of the trace at the first region is transparent and form the transparent region; or the first substrate includes a first base substrate and a trace arranged on the first base substrate, the first base substrate is a transparent substrate, and the trace is arranged to avoid the first region so as to form the transparent region.

Optionally, the lens assembly is arranged on the first surface, the image sensor is arranged on the second surface, and an orthographic projection of the lens assembly onto the first substrate falls within or coincides with an orthographic projection of the image sensor onto the first substrate.

Optionally, the first substrate includes a first base substrate and a trace arranged on the first base substrate, the trace is connected to the display driving circuit, and the image sensor is connected to the trace on the first base substrate through a binding connection or a solder-ball connection so that the image sensor is connected to the display driving circuit, or the image sensor is directly connected to the display driving circuit through the binding-connection or the solder-ball connection.

Optionally, the display device further includes a transparent cover plate arranged at a side of the second substrate away from the first substrate, wherein the transparent cover plate extends beyond the second substrate and at least covers the single-substrate area so as to cover the lens assembly.

Optionally, the lens assembly includes: a fixation bracket; a light collection lens arranged on the fixation bracket, wherein a light-incident surface of the light collection lens faces towards a side of the display panel at which the second substrate is located; a group of lenses arranged on the fixation bracket and arranged to a side of a light-emergent surface of the light collection lens; and a filter arranged at a side of the group of lenses away from the light collection lens.

Optionally, the lens assembly further includes a focusing motor, the focusing motor is arranged on the first surface of the first substrate and configured to adjust a distance between the group of lenses and the image sensor, and the group of lenses is arranged on the focusing motor and is moveable when the group of lenses is driven by the focusing motor.

Optionally, the fixation bracket, the light collection lens and the group of lenses are arranged on the first surface of the first substrate, and the filter and the image sensor are arranged on the second surface of the first substrate.

Optionally, the lens assembly includes: the fixation bracket; the light collection lens arranged on the fixation bracket, wherein the light-incident surface of the light collection lens faces towards a side of the display panel at which the second substrate is located; the group of lenses arranged on the fixation bracket and arranged to a side of a light-emergent surface of the light collection lens; and the filter arranged at a side of the group of lenses away from the light collection lens, wherein the fixation bracket, the light collection lens, the group of lenses, the filter and the image sensor are arranged on the first surface of the first substrate.

Optionally, the image sensor is connected to the display driving circuit through a conductive adhesive.

Optionally, the display device further includes a backlight source, wherein the backlight source includes a backlight-source driving circuit connected to the display driving circuit, and the image sensor is connected to the backlight-source driving circuit through the binding connection or the solder-ball connection so that the image sensor is connected to the display driving circuit.

In a second aspect, a method for manufacturing the display device according to the first aspect is provided in the present disclosure and includes arranging the lens assembly and the image sensor at the single-substrate area; and electrically connecting the image sensor with the display driving circuit.

Optionally, the first substrate includes a first surface facing towards the second substrate and a second surface opposite to the first surface, and the single-substrate area includes a first region, wherein the arranging the lens assembly and the image sensor at the single-substrate area includes: arranging the lens assembly on the first surface of the first substrate, wherein an orthographic projection of the lens assembly onto the first substrate includes or falls within the first region; and arranging the image sensor on the second surface of the first substrate, wherein the orthographic projection of the lens assembly onto the first substrate falls within or coincides with an orthographic projection of the image sensor onto the first substrate.

Optionally, prior to arranging the lens assembly on the first surface of the first substrate, the method further includes: forming a through-hole in the first region of the first substrate; the arranging the lens assembly on the first surface of the first substrate includes: arranging the lens assembly on the first surface of the first substrate, wherein an orthographic projection of the through-hole onto the first substrate falls within the orthographic projection of the lens assembly onto the first substrate, and the arranging the image sensor on the second surface of the first substrate includes: arranging the image sensor on the second surface of the first substrate, wherein the orthographic projection of the lens assembly onto the first substrate falls within or coincides with the orthographic projection of the image sensor onto the first substrate.

Optionally, the first substrate includes a first base substrate and a trace, the trace is arranged on the first base substrate and connected to the display driving circuit; electrically connecting the image sensor with the display driving circuit includes: connecting the image sensor with the trace on the first base substrate through a binding connection or a solder-ball connection, so that the image sensor is connected to the display driving circuit; or connecting the image sensor with the display driving circuit through the binding connection or the solder-ball connection.

Optionally, the display device further includes a backlight source, the backlight source includes a backlight-source driving circuit, the backlight-source driving circuit is connected to the display driving circuit, wherein the electrically connecting the image sensor with the display driving circuit includes: connecting the image sensor with the backlight-source driving circuit through a binding connection or a solder-ball connection, so that the image sensor is electrically connected to the display driving circuit.

DETAILED DESCRIPTION

Figure 1:
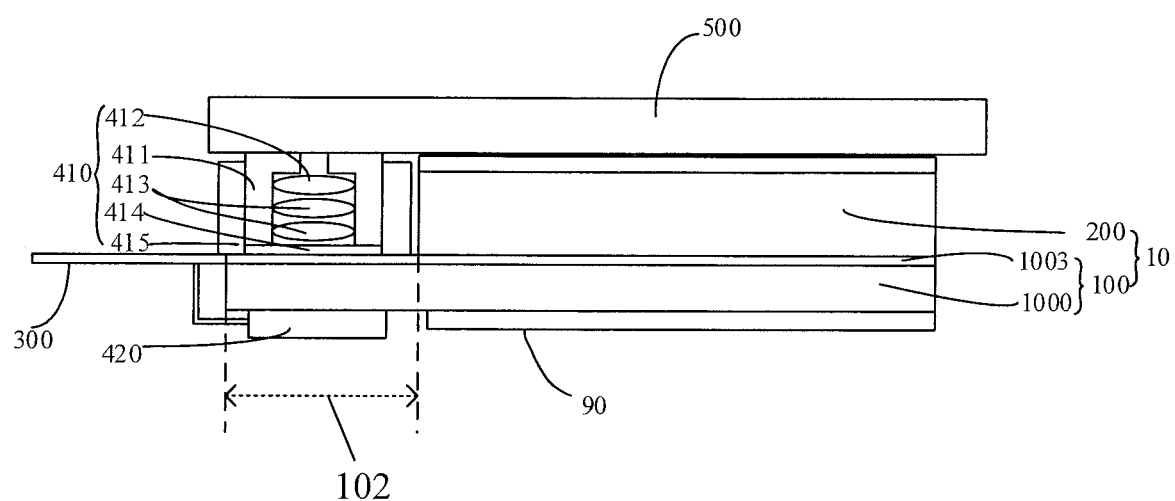
FIG. 1 is a front view of a structure of a display device according to some embodiments of the present disclosure.

In order to make technical problems to be addressed by the present disclosure, technical solutions and advantages of the present disclosure more apparent, the present disclosure will be described hereinafter in conjunction with drawings and embodiments of the present disclosure.

The present disclosure provides a display device. The display device may effectively reduce a footprint occupied by a camera module in the display device, and thereby a screen-to-body ratio of a screen of the display device is increased.

As shown in FIGS. 1 to 6, some embodiments of the present disclosure provide the display device. The display device includes a display panel 10, a display driving circuit 300 and a camera module 400. The display panel 10 includes a first substrate 100 and a second substrate 200 arranged opposite to each other to form a cell. A projection of the first substrate 100 on a plane in which the second substrate 200 is located extends beyond the second substrate 200, and a portion of the projection of the first substrate 100 extending beyond the second substrate 200 corresponds to a single-substrate area 102 of the first substrate 100. The display driving circuit 300 electrically connected to the display panel 10. The camera module 400 includes a lens assembly 410 configured to collect image information and an image sensor 420 configured to receive the image information collected by the lens assembly 410. The lens assembly 410 and the image sensor 420 are arranged at the single-substrate area 102, and the image sensor 420 is electrically connected to the display driving circuit 300.

According to some embodiments of the present disclosure, the display panel 10 of the display device is provided with the single-substrate area 102 in the first substrate 100, i.e., the portion of the projection of the first substrate 100 extending beyond the second substrate 200 corresponds to the single-substrate area 102 in the first substrate 100. The lens assembly 410 and the image sensor 420 of the camera module 400 are arranged at the single-substrate area, and the first substrate 100 is used to fixedly support the camera module 400, i.e., the first substrate 100 may be a fixed support plate of the camera module 400, so as to integrate the camera module 400 into the display panel 10. As a result, a space outside the display panel may be reduced in the display device, and thereby the screen-to-body ratio is increased.

It should be appreciated that, the above display panel 10 may be a liquid crystal display panel or an organic light-emitting diode (OLED) display panel.

Considering an example that the display panel 10 is the liquid crystal display panel, the liquid crystal display panel includes an array substrate and a color filter substrate arranged opposite to each other to form a cell (in such a case, the first substrate 100 is the array substrate, and the second substrate 200 is the color filter substrate). A portion at one side of the array substrate may extend beyond the color filter substrate, and traces are arranged on the portion at the one side of the array substrate and are configured to be connected to the display driving circuit of the display panel. The display device provided in some embodiments of the present disclosure takes the portion of the array substrate extending beyond the color filter substrate as the single-substrate area 102, and the camera module 400 may be arranged at the single-substrate area 102. In this way, the camera module 400 may be supported and fixed by directly using the single-substrate area 102 of the array substrate, so as to increase the screen-to-body ratio. It may be appreciated that, in actual applications, the display panel is not limited to the liquid crystal display panel, and the single-substrate area may be provided in ways other than the way described above.

The display device will be described hereinafter in details by taking the liquid crystal display panel as an example of the display panel 10.

As shown in FIGS. 1 to 4, in some embodiments of the present disclosure, the first substrate 100 includes a first surface 1001 facing towards the second substrate 200 and a second surface 1002 opposite to the first surface 1001. The single-substrate area 102 includes a first region 110, and the first region 110 is a transparent region. The lens assembly 410 is arranged on the first surface 1001, and an orthographic projection of the lens assembly 410 onto the first substrate 100 includes the first region 110 or falls within the first region 110. The image sensor 420 is arranged on the second surface 1002, and the orthographic projection of the lens assembly 410 onto the first substrate 100 falls within or coincides with an orthographic projection of the image sensor 420 onto the first substrate 100.

According to the above, the lens assembly 410 of the camera module 400 is arranged on the first surface 1001 of the first substrate 100, the image sensor 420 of the camera module 400 is arranged on the second surface 1002 of the first substrate 100, and the first region of the first substrate 100 corresponding to the camera module 400 is the transparent region. In this way, light rays collected by the lens assembly 410 may pass through the first region 110 of the first substrate 100 and be received by the image sensor 420. The first substrate 100 may be used as a fixed support plate for the lens assembly 410 and the image sensor 420, so as to fix and support an entirety of the camera module 400. As compared with a relevant camera module, a shell of a mobile phone is not needed for fixing and supporting the camera module any longer. In addition, since the image sensor 420 is directly fixed onto the first substrate 100, and the first substrate 100 is provided with a trace 1003 connected to the display driving circuit 300 (a driving integrated circuit (IC)), the image sensor 420 may be directly connected to the display driving circuit 300 via the trace 1003 and be driven by the display driving circuit 300. Thus, a trace-connection substrate for the relevant camera module is not needed additionally, thereby to reduce a thickness of an entirety of the camera module as well as a thickness of an entirety of the display device.

It should be appreciated that, the lens assembly 410 may include a light collection lens 412, a plurality of lenses 413 and a filter 414. In other words, in actual applications, the light collection lens 412, the plurality of lenses 413 and the filter 414 of the camera module 400 may be arranged on the first surface 1001 of the first substrate 100, and the image sensor 420 may be arranged on the second surface 1002 of the first substrate 100. In this way, on one hand, relative location and space requirements among components of the camera module 400 may be met, e.g., relative position and space requirements among the plurality of lenses 412 and the image sensor 420 may be met; on the other hand, due to a thickness of the display panel 10 being limited, only the lens assembly 410 may arranged on the first surface 1001 of the first substrate 100, thereby to properly arrange and make full use of space in the single-substrate area 102 along a thickness direction of the display panel 10.

Figure 9:
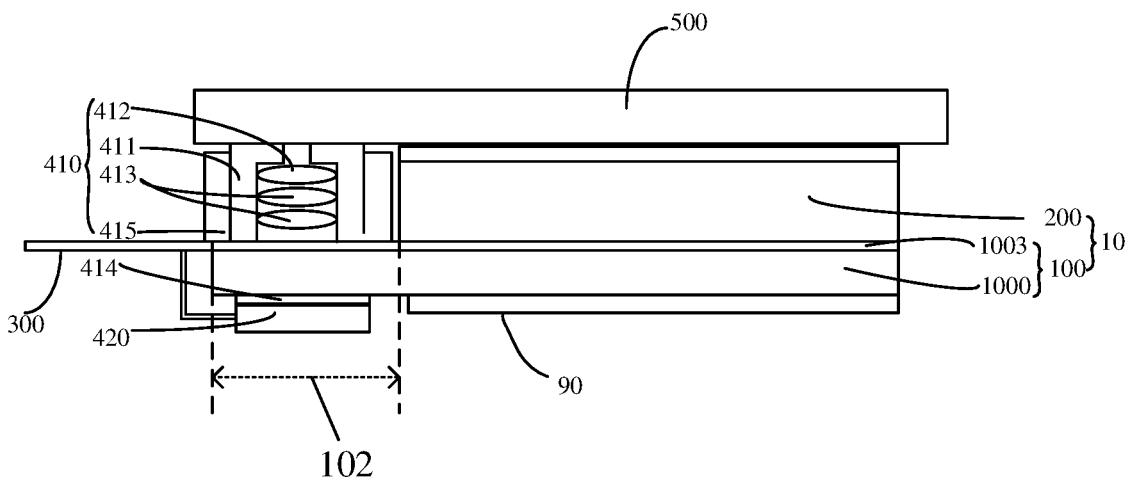
FIG. 9 is a front view of another structure of a display device according to some embodiments of the present disclosure.

Arrangements of the components of the camera module 400 at the single-substrate area 102 may not be limited to the above. For example, in some other embodiments of the present disclosure, the filter 414 and the image sensor 420 may optionally be arranged sequentially on the second surface 1002 of the first substrate 100, and the filter 414 is arranged closer to the first substrate 100 than the image sensor 420, as shown in FIG. 9.

Figure 5:
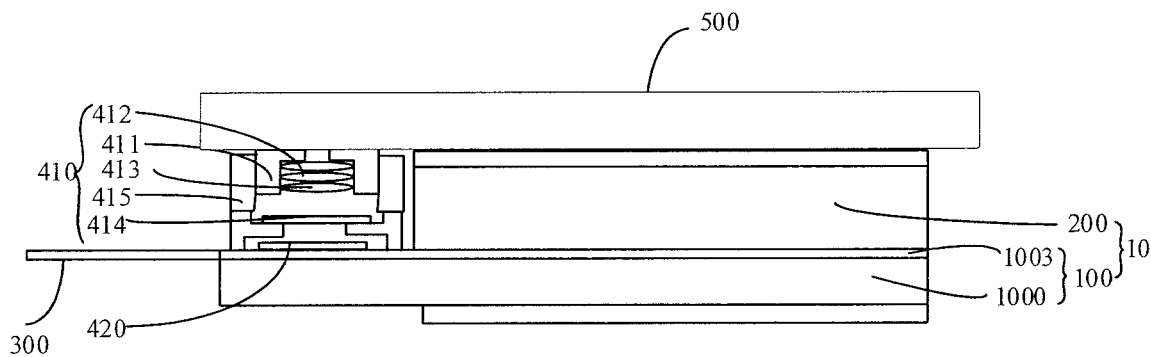
FIG. 5 is a schematic view of the structure of the display device according to some embodiments of the present disclosure.
Figure 6:
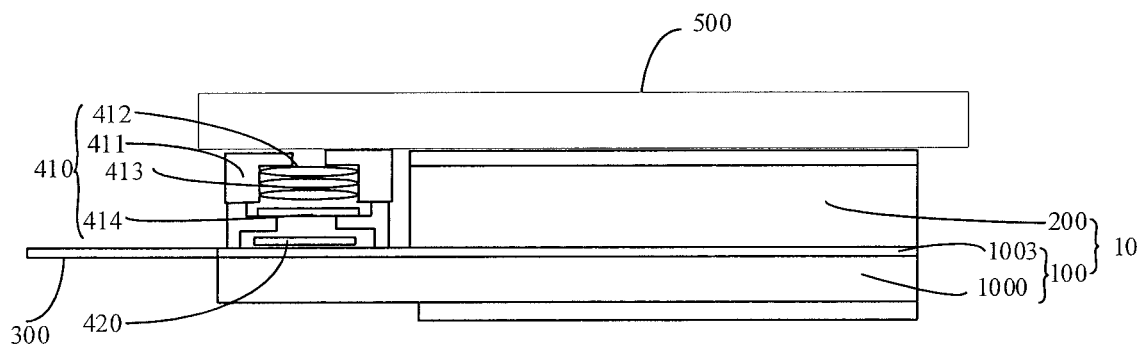
FIG. 6 is a schematic view of the structure of the display device according to some embodiments of the present disclosure.
Figure 7:
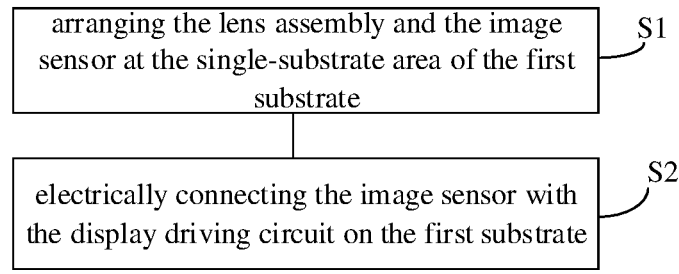
FIG. 7 is a flowchart of a method for manufacturing the display device according to some embodiments of the present disclosure.
Figure 8:
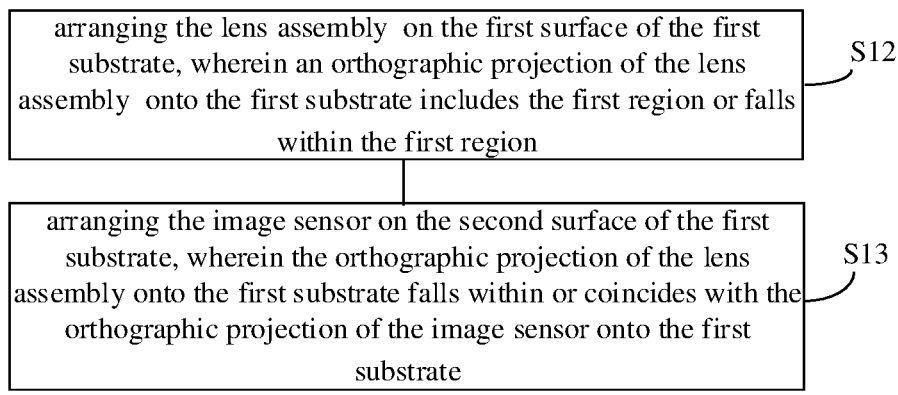
FIG. 8 is a detailed flowchart of steps of the method for manufacturing the display device according to some embodiments of the present disclosure.

Optionally, as shown in FIGS. 5 and 6, both the lens assembly 410 and the image sensor 420 may be arranged on the first surface 1001 of the first substrate 100. In this case, the first region 110 of the first substrate 100 may not be transparent, and the image sensor 420 may be closer to the first substrate 100 than the filter 414.

In addition, in the display device provided in some embodiments of the present disclosure, the first region 110 of the single-substrate area (i.e., the transparent region corresponding to the camera module 400) may be formed to be transparent through the following way.

Figure 2:
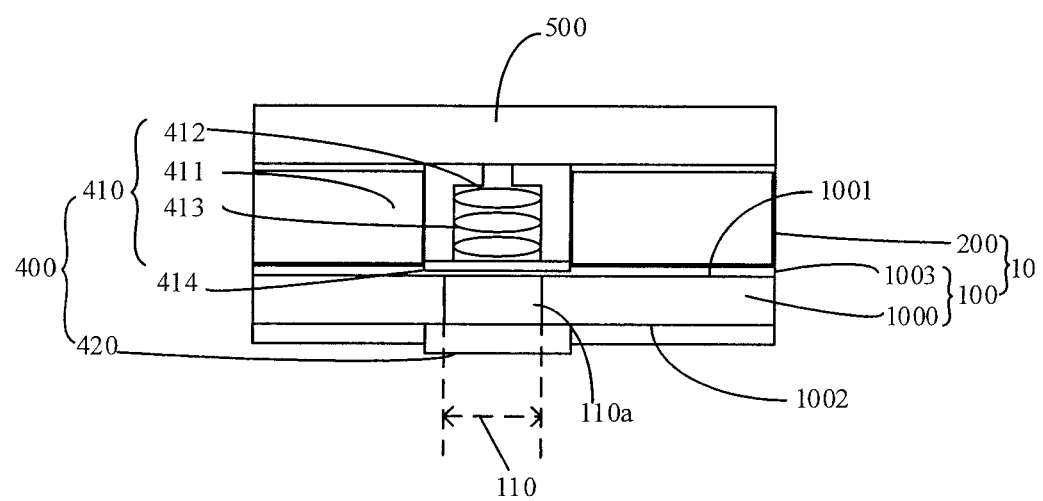
FIG. 2 is a side view of the display device shown in FIG. 1.

As shown in FIG. 2, the first region 110 of the first substrate 100 is provided with a through-hole 110*a* penetrating through the first surface 1001 and the second surface 1002, so as to form the transparent first region 110.

According to the above, the transparent first region 110 may be formed by forming the through-hole 110*a* in the single-substrate area. The lens assembly 410 may be fixed onto the first surface 1001 of the first substrate 100 at a position corresponding to the through-hole 110*a*, and the image sensor 420 may be fixed on the second surface 1002 of the first substrate 100 at the position corresponding to the through-hole 110*a*. In this way, the light rays collected by the lens assembly 410 may pass through the through-hole 110*a* and enter the image sensor 420.

Optionally, an axis of the lens assembly 410 coincides with an axis of the through-hole 110*a*, and an axis of the image sensor 420 coincides with the axis of the through-hole 110*a*.

It should be understood that, the present disclosure does not specifically limit that the axis of the lens assembly 410 coincides with the axis of the through-hole 110*a* and the axis of the image sensor 420 coincides with the axis of the through-hole 110*a*. Optionally, the lens assembly 410 and the image sensor 420 may be arranged at any position, e.g., in a left side or a right side, of the first region, as long as the image sensor 420 may receive the light rays passing through the lens assembly 410.

It should be further appreciated that, a shape of the through-hole 110 is not be particularly limited herein, and may be a regular shape, e.g., a square shape, a circular shape or a L-shaped shape, or may be an irregular shape. A size of the through-hole 110*a* may be associated with a size needed for reception of the light rays by the image sensor 420, sizes of the plurality of lenses 413 and a thickness of the first substrate 100.

Figure 4:
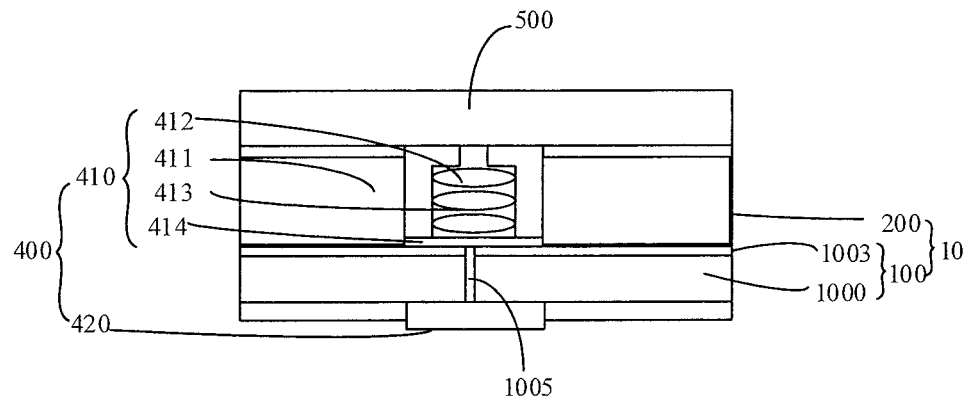
FIG. 4 is a side view of the display device shown in FIG. 3A.

It should be further appreciated that, the first region 110 of the first substrate 100 is arranged as the transparent region corresponding to the camera module 400 by forming the through-hole 110*a* in the single-substrate area 102. In actual applications, the transparent region may also be formed in other ways. For example, in some embodiments of the present disclosure, the first substrate 100 may include a first base substrate 1000 and a trace 1003 arranged on the first base substrate 1000, and each of a portion of the first base substrate 1000 at the first region 110 and a portion of the trace 1003 at the first region 110 may be transparent, so as to form the transparent region, as shown in FIG. 4.

Based on the above, in case that the first substrate 100 is the array substrate, the trace 1003 is arranged at the single-substrate area 102 and the first substrate 100 is a transparent substrate (e.g., a glass substrate). A portion of the trace 1003 corresponding to the first region 110 at which the camera module 400 needs to be arranged on the first substrate 100 may be made of a transparent material (e.g., Indium Tin Oxide (ITO)), so as to form the transparent region. It should be appreciated that, as compared with the way in which the transparent region is formed by forming the through-hole in the first substrate, no through-hole is needed to be arranged in the first substrate, and a manufacture process is simple and an arrangement of the trace is not influenced by forming the through-hole. However, light loss may occur due to transparency of the trace and the first base substrate.

Optionally, in some embodiments of the present disclosure, the first substrate 100 may include the first base substrate 100 and the trace 1003 arranged on the first base substrate 100, the first base substrate 1000 may be the transparent substrate, and the trace 1003 may be arranged to avoid at least a part of the single-substrate area (i.e., the first region), so as to form the transparent region.

Based on the above, in case that the first substrate 100 is the array substrate, the trace 1003 may be arranged at the single-substrate area 102 and the first substrate 100 may be the transparent substrate (e.g., a glass substrate). At the first region 110 at which the camera module 400 is arranged, the trace 1003 on the first substrate 100 may be arranged to avoid a part of the single-substrate area 102 (i.e., the first region 110), so as to form the transparent first region 110. It should be appreciated that, no through-hole is needed to be arranged in the first substrate 100 according to the above arrangement, the manufacture process is simple, and a material of the trace is not limited. However, in case that the first substrate is the array substrate, the trace on the array substrate is generally distributed densely, a sufficient space is needed on the array substrate so that the trace may be arranged to avoid the first region.

In the above description, three different ways are provided to form the transparent first region 110. The way in which the transparent first region is formed through the through-hole 110a in the first substrate 100 has following advantages in comparison with other ways: a structure formed in the way is simpler, a manufacture process is easier, and the light rays collected by the lens assembly 410 are not affected.

In addition, in some embodiments of the present disclosure, since the image sensor 420 is directly fixed onto the first substrate 100 and the trace 1003 connected to the display driving circuit 300 is arranged on the first substrate 100, the display driving circuit 300 may be connected to the image sensor 420, so that the display driving circuit 300 may drive the camera module 400. In this way, the relevant trace-connection substrate for the camera module is not needed additionally, and thereby the thickness of the entirety of the camera module 400 and the thickness of the display device are reduced.

Optionally, as shown in FIGS. 1 and 3A-3C, the image sensor 420 may be directly connected to the display driving circuit 300, or be connected to the display driving circuit 300 through a binding connection or a solder-ball connection 1005, so that the image sensor 402 may be driven by the display driving circuit 300. Optionally, the image sensor 420 may be connected to the display driving circuit 300 through the following four ways.

Figure 3A:
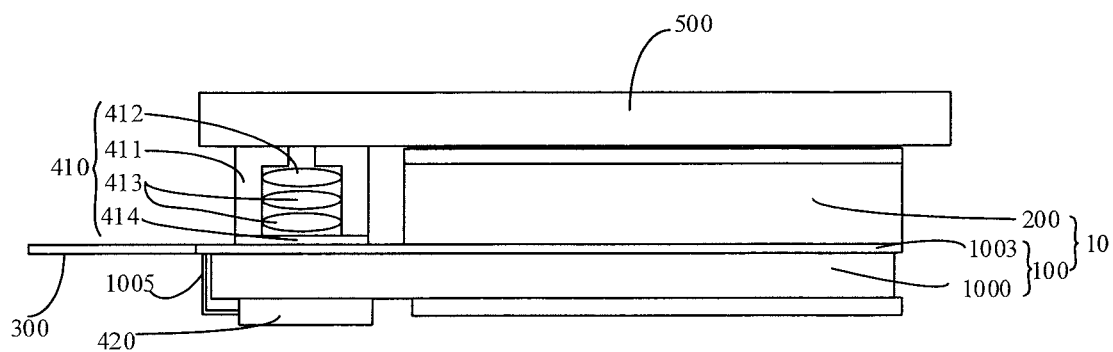
FIG. 3A to FIG. 3C are schematic views of the structure of the display device according to some embodiments of the present disclosure.

A first way: the image sensor 420 may be arranged on the first surface 1001 or the second surface 1002 of the first substrate 100; the first substrate 100 may include the first base substrate 1000 and the trace 1003, the trace 1003 is arranged on the first base substrate 1000 and connected to the display driving circuit 300. The image sensor 420 may be connected to the trace 1003 on the first substrate 100 through the binding connection or the solder-ball connection, so that the image sensor 420 may be connected to and driven by the display driving circuit 300 or may be connected to a separate Central Processing Unit (CPU) via the trace 1003 and driven by the CPU, as shown in FIG. 3A.

Based on the above, in case that the first substrate 100 is the array substrate, the trace 1003 may be arranged at the single-substrate area 102 of the first substrate 100 and the trace 1003 may be directly connected to the image sensor 420, so that the image sensor 420 may be driven by the display driving circuit 300. Since the image sensor 420 may be connected to the trace 1003 on the first substrate 100 through the binding connection, e.g., a binding connection line, or through the solder-ball connection, the relevant trace-connection substrate for the camera module is not needed.

A second way: the image sensor 420 may be arranged on the first surface 1001 of the first substrate 100; the first substrate 100 may include the first base substrate 1000 and the trace 1003, the trace 1003 is arranged on the first base substrate 1000 and connected to the display driving circuit 300; a separate trace connected to the image sensor 420 may be arranged on the first surface 1001 of the first substrate 100, and both this separate trace and the trace 1003 on first substrate 100 may be connected to a separate processor, so that the image sensor 420 may be driven by the separate processor.

Figure 3B:
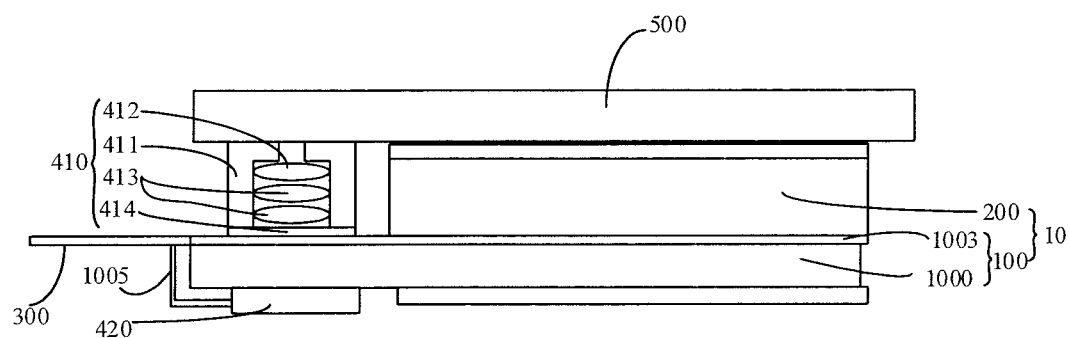
Figure 3C:
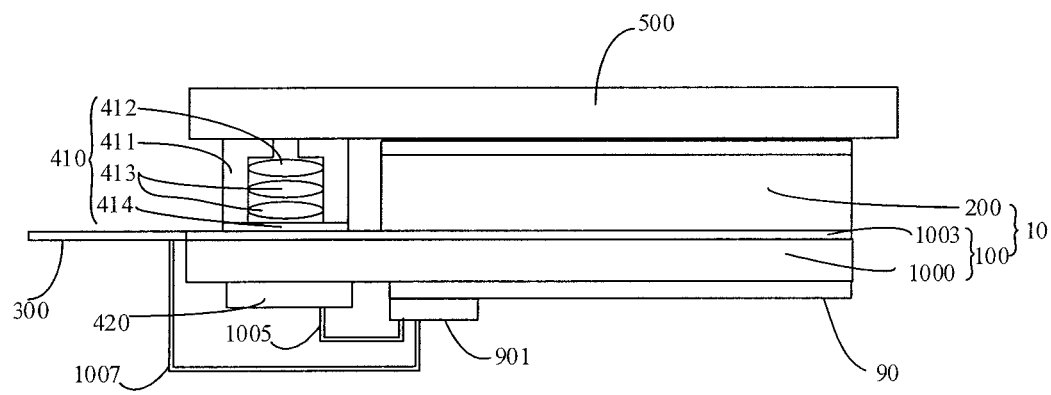

A third way, the image sensor 420 may be arranged on the first surface 1001 or the second surface 1002 of the first substrate 100, and may be connected to the display driving circuit 300 or a separate processor through the binding connection or the solder-ball connection 1005, as shown in FIG. 3B.

Based on the above, in case that the first substrate 100 is the array substrate, a separate trace may be connected to the image sensor 420 through the binding-connection or the solder-ball connection, and the separate trace is directly connected to the display driving circuit 300 or the separate processor, so that the image sensor 420 may be driven through the display driving circuit 300 or the separate processor, and the relevant trace-connection substrate for the camera module is not needed.

A fourth way: the display device may further include a backlight source 90; the backlight source 90 includes a backlight-source driving circuit 901 electrically connected to the display driving circuit 300 through a connection 1007; the image sensor 420 is connected to the backlight-source driving circuit 901 through the binding connection or the solder-ball connection 1005, so that the image sensor 420 may be driven by the display driving circuit 300, or may be connected to a separate CPU through the connection 1007 and be driven by the separate CPU.

The display device further includes the backlight-source driving circuit 901, and the backlight-source driving circuit 901 is electrically connected to the display driving circuit 300. Based on the above, the image sensor 420 may be connected to the backlight-source driving circuit 901 through the binding-connection or the solder-ball connection, so that the image sensor 420 may be electrically connected to the display driving circuit 300, and the relevant trace-connection substrate for the camera module 400 is not needed.

It should be noted that, besides the binding-connection or the solder-ball connection provided above, the image sensor 420 may also be directly connected to the display driving circuit 300 or through other ways. For example, the image sensor 420 may also be electrically connected to the display driving circuit 300 through a conductive adhesive such as an anisotropic conductive adhesive. In addition, in case that the image sensor 420 is arranged on the second surface 1002 of the first substrate 100, a through-hole may be formed in the single-substrate area of the first substrate, and a trace connected to the image sensor 420 may pass through the through-hole, so that the image sensor 420 may be connected to the display driving circuit or the separate processor.

Additionally, it should be noted that, in case that both the display panel and the image sensor 420 are driven by the display driving circuit 300, the display driving circuit 300 may be provided with an additional component for applying a corresponding electric signal to the image sensor. In addition, depending on types of display devices, in case that the image sensor is connected to the display driving circuit through the binding-connection or the solder-ball connection, a display driving function of the display panel may not be adversely affected.

In some embodiments of the present disclosure, the camera module 400 may be a zoom camera module (i.e., a variable-focus camera module) or a prime camera module (i.e. a fixed-focus camera module), and a type of the camera module 400 is not particularly defined herein. In order to describe the display device in some embodiments of the present disclosure more clearly, a specific structure of the camera module 400 is described hereinafter.

FIG. 1 and FIG. 2 show an example that the camera module 400 is the variable-focus camera module, and FIG. 5 shows another example that the camera module 400 is the variable-focus camera module. As shown in FIGS. 1, 2 and 5, when the camera module 400 is the variable-focus camera module, the lens assembly 410 includes: a fixation bracket 411; the light collection lens 412 arranged on the fixation bracket 411, wherein a light-incident surface of the light collection lens 412 faces towards a side of the display panel at which the display surface of the display panel (i.e., facing upwards in the Figures); a group of lenses 413 arranged on the fixation bracket 411 and at a light-emergent surface of the light collection lens 412, and including at least one lens, e.g., two or three lenses; the filter 414 arranged at a side of the group of lenses 413 facing away from the light collection lens 412 and arranged on the fixation bracket 411; and, a focusing motor 415 configured to adjust a distance between the group of lenses 413 and the image sensor 420. The group of lenses 413 is arranged on the focusing motor 415 and capable of being driven by the focusing motor 415 to move. The filter 414 may be a visible-light filtration membrane or an infrared-light filtration membrane, e.g., a blue glass membrane. The filter 414 may be formed by coating a layer onto the single-substrate area 102 of the first substrate 100, thereby reducing a thickness of the filter 414.

It should be noted that, the focusing motor 415 may be a voice coil motor. The above is the example that the camera module 400 is the variable-focus camera module 400, and the present disclosure is not limited thereto. In actual applications, the camera module 400 may have any other structure which will not be exemplarily described herein. The focusing motor 415 may be fixed onto the first substrate 100 through an adhesive (e.g., an Optically Clear Adhesive (OCA) or an Anisotropic Conductive Film (ACF)), or a snap-fit connection, or a combination of the adhesive and the snap-fit connection.

FIGS. 3A-3C and 4 show an example that the camera module 400 is the fixed-focus camera module, and FIG. 6 shows another example that the camera module 400 is the fixed-focus camera module. As shown in FIGS. 3A-3C, 4 and 6, when the camera module 400 is the fixed-focus camera module, the lens assembly 410 includes: the fixation bracket 411; the light collection lens 412 arranged on the fixation bracket 411, wherein the light-incident surface of the light collection lens 412 faces towards the side of the display panel at which the display surface of the display panel (i.e., facing upwards in the Figures); the group of lenses 413 arranged on the fixation bracket 411 and at the light-emergent surface of the light collection lens 412, and including at least one lens, e.g., two or three lenses; the filter 414 arranged at the side of the group of lenses 413 facing away from the light collection lens 412 and arranged on the fixation bracket 411. The filter 414 may be the visible-light filtration membrane or the infrared-light filtration membrane, e.g., the blue glass membrane. The filter 414 may be formed by coating the layer onto the single-substrate area 102 of the first substrate 100, thereby reducing the thickness of the filter 414.

It should be noted that, the above is the example that the camera module 400 is the fixed-focus camera module, and the present disclosure is not limited thereto. In actual applications, the camera module 400 may have any other structure, which will not be exemplarily described herein.

Additionally, in some embodiments of the present disclosure, as shown in FIGS. 1-6, the display device further includes a transparent cover plate 500. The transparent cover plate 500 is arranged at a side of the second substrate 200 away from the first substrate 100. A projection of the transparent cover plate 500 on the plane in which the second substrate 200 is located extends beyond the second substrate 200 and at least covers a projection of the single-substrate area 102 on the plane in which the second substrate 200 is located, so as to cover the lens assembly 410.

Based on the above, the transparent cover plate 500 is further arranged at the side of the display panel 10 at which the display surface of the display panel 10 is arranged, and the transparent cover plate 500 covers the single-substrate area 102 of the first substrate 100 beyond the second substrate 200, and thus the transparent cover plate 500 forms an accommodation space in cooperation with the single-substrate area 102 of the first substrate 100. The lens assembly 410 of the camera module 400 is accommodated within the accommodation space. In this way, the transparent cover plate 500 covers the lens assembly 410, so as to enable an appearance of a screen of the display device to be integral and artistic. In addition, the transparent cover plate 500 may protect the lens assembly 410.

In addition, in some embodiments of the present disclosure, the lens assembly 410 may be arranged on the first substrate 100 fixedly or removably. Optionally, the lens assembly 410 may be adhered onto the first substrate 100 through an adhesive, e.g., the OCA or then ACF, and/or the lens assembly 410 may be fixed onto the first substrate 100 through the snap-fit connection.

Based on the above, the lens assembly 410 may be fixed onto the first substrate 100 through the adhesive, or the snap-fit connection, or a combination of the adhesive and the snap-fit connection. Such fixation is simple in terms of an assembly process and a structure. It should be understood that, in actual applications, the lens assembly 410 may also be fixed onto the first substrate 100 in any other way, which is not particularly defined herein.

In addition, in some embodiments of the present disclosure, the image sensor 420 may be arranged on the first substrate 100 fixedly or removably. Optionally, the image sensor 420 may be adhered onto the first substrate 100 through the adhesive, e.g., the OCA or the ACF, or the image sensor 420 may be fixed onto the first substrate 100 through the binding connection or the solder-ball connection.

Based on the above, in some embodiments of the present disclosure, since the image sensor 420 may be electrically connected to the display driving circuit 300 through the binding connection or the solder-ball connection, the image sensor 420 may be fixed onto the first substrate 100 directly through the binding connection or the solder-ball connection. In addition, the image sensor 420 may also be fixed onto the first substrate 100 through the adhesive, or may be fixed onto the first substrate 100 through the combination of the binding connection or the solder-ball connection. It should be appreciated that, in actual applications, the image sensor 420 may also be fixed onto the first substrate 100 in any other way, which is not particularly described herein.

It should be further noted that, the display device in some embodiments of the present disclosure may include various display products, e.g., a mobile phone, a computer or a tablet.

Some embodiments of the present disclosure further provide a method for manufacturing the display device provided in some embodiments of the present disclosure. The method includes a step S1 and a step S2.

Step S1: arranging the lens assembly and the image sensor at the single-substrate area of the first substrate.

Step S2: electrically connecting the image sensor with the display driving circuit on the first substrate.

According to the above, the lens assembly 410 and the image sensor 420 of the camera module 400 are arranged at the single-substrate area 102 of the display panel 10, and the first substrate 100 is used for supporting the camera module 400. Thus, the camera module 400 may be integrated into the display panel 10. As compared with a relevant camera module arranged outside a periphery of the display panel 10, the camera module 400 of the present disclosure is not arranged separately outside the display panel 10, but arranged in the single-substrate area of the display panel 10. Thus, a footprint occupied by the camera module outside the display device is reduced, and thereby the screen-to-body ratio is reduced.

Optionally, the step S1 of arranging the lens assembly and the image sensor at the single-substrate area of the first substrate may include substeps S12 and S13.

Substep S12: arranging the lens assembly 410 on the first surface of the first substrate 100, wherein an orthographic projection of the lens assembly 410 onto the first substrate 100 includes the first region or falls within the first region.

Substep S13: arranging the image sensor 420 on the second surface of the first substrate 100, wherein the orthographic projection of the lens assembly 410 onto the first substrate 100 falls within or coincides with the orthographic projection of the image sensor 420 onto the first substrate 100.

Optionally, prior to the substep S12, the method may further include a substep S11.

Substep S11: forming a through-hole in the first region of the first substrate, wherein the through-hole penetrates through the first surface and the second surface of the first substrate.

The substep S12 may specifically include: arranging the lens assembly 410 on the first surface of the first substrate, wherein the orthogonal projection of the through-hole onto the first substrate falls within the orthogonal projection of the lens assembly onto the first substrate.

The substep S13 may specifically include: arranging the image sensor 420 on the second surface of the first substrate, wherein the orthogonal projection of the lens assembly onto the first substrate falls within or coincides with the orthogonal projection of the image sensor onto the first substrate.

Based on above, the camera assembly 410 of the camera module 400 is arranged on the first surface of the first substrate 100, the image sensor 420 of the camera module 400 is arranged on the second surface of the first substrate 100, and the first region of the first substrate 100 corresponding to the camera module 400 is the transparent region. In this way, the light rays collected by the lens assembly 410 may pass through the transparent region of the first substrate 100 and be received by the image sensor 420. The first substrate 100 may be used to support the camera assembly 410 and the image sensor 420, so as to fix and support the entirety of the camera module 400. As compared with the relevant camera module, the shell of the mobile phone is not needed for fixing and supporting the camera module any longer. In addition, since the image sensor 420 is directly fixed onto the first substrate 100, and the first substrate 100 is provided with the trace connected to the display driving circuit 300 (the driving IC), the image sensor 420 may be directly connected to the display driving circuit 300 via the trace. Thus, the trace-connection substrate for the relevant camera module is not needed, thereby to reduce the thickness of the entirety of the camera module as well as the thickness of the entirety of the display device.

Optionally, the step S2 of electrically connecting the image sensor with the display driving circuit on the first substrate may include a substep S21, a substep S22 or a substep S23.

Substep S21: connecting the image sensor 420 with the trace 1003 on the first substrate 100 through the binding-connection or the solder-ball connection, that the image sensor 420 is electrically connected to the display driving circuit 300.

Substep S22: connecting the image sensor 420 with the display driving circuit 300 through the binding-connection or the solder-ball connection.

Substep S23: connecting the image sensor 420 with the backlight-source driving circuit 901 through the binding-connection or the solder-ball connection, so that the image sensor 420 is electrically connected to the display driving circuit 300.

Based on the above, the image sensor 420 may be connected to the trace 1003 on the first substrate 100 through the binding-connection or the solder-ball connection, or be directly connected to the display driving circuit 300 through the binding-connection or the solder-ball connection, so that the display driving circuit 300 may drive both the display panel and the image sensor. The image sensor 420 may also be connected to the backlight-source driving circuit through the binding-connection or the solder-ball connection, so that the display driving circuit 300 may drive all of the display panel, the image sensor 420 and the backlight-source driving circuit. According to the above, the trace-connection substrate for the relevant camera module is not needed, the thickness of the camera module 400 and the thickness of the entirety of the display device are reduced, and the screen-to-body ratio is increased.

The above are optional embodiments of the present disclosure. It should be noted that, a person skilled in the art may make numerous modifications and embellishments without departing from the scope of the present disclosure, and these modifications and embellishments also fall within the scope of the present disclosure.

What is claimed is:

1. A display device, comprising:
    a display panel, comprising an array substrate and a color filter substrate arranged opposite to the array substrate, wherein the array substrate comprises a single-substrate area beyond the color filter substrate;
    a display driving circuit electrically connected to the display panel;
    a lens assembly arranged at the single-substrate area of the array substrate and configured to collect light information; and
    an image sensor arranged at the single-substrate area of the first substrate, connected to the display driving circuit, and configured to receive the light information collected by the lens assembly,
    wherein the single-substrate area comprises a first region, the first region is a transparent region, the array substrate comprises a first base substrate and a trace arranged on the first base substrate, and a portion of the first base substrate and a portion of the trace at the first region is transparent and form the transparent region,
    the array substrate comprises a first surface facing towards the color filter substrate and a second surface opposite to the first surface, the trace is arranged on the array substrate, an entirety of the first surface is a planar surface, an entirety of the second surface is a planar surface, an entirety of the trace directly contacts the first surface, and an entirety of the image sensor is fixed on the array substrate and an entirety of a first side of the image sensor directly contacts the second surface,
    wherein the image sensor is directly connected to the display driving circuit through a first binding connection or a first solder-ball connection; or
    the display device further comprises a backlight source, wherein the backlight source comprises a backlight-source driving circuit connected to the display driving circuit, and the image sensor is connected to the backlight-source driving circuit through a second binding connection or a second solder-ball connection so that the image sensor is connected to the display driving circuit.

2. The display device according to claim 1, wherein the lens assembly is arranged on the first surface, and an orthographic projection of the lens assembly onto the array substrate includes the first region or falls within the first region.

3. The display device according to claim 1, wherein the lens assembly is arranged on the first surface, and an orthographic projection of the lens assembly onto the array substrate falls within or coincides with an orthographic projection of the image sensor onto the array substrate.

4. The display device according to claim 1, further comprising:
    a transparent cover plate arranged at a side of the color filter substrate away from the array substrate, wherein the transparent cover plate extends beyond the color filter substrate and at least covers the single-substrate area so as to cover the lens assembly.

5. The display device according to claim 2, wherein the lens assembly comprises:
    a fixation bracket;
    a light collection lens arranged on the fixation bracket, wherein a light-incident surface of the light collection lens faces towards a side of the display panel at which the color filter substrate is located;
    a group of lenses arranged on the fixation bracket and arranged to a side of a light-emergent surface of the light collection lens; and
    a filter arranged at a side of the group of lenses away from the light collection lens.

6. The display device according to claim 2, wherein the lens assembly further comprises a focusing motor, the focusing motor is arranged on the first surface of the array substrate and configured to adjust a distance between a group of lenses and the image sensor, and the group of lenses is arranged on the focusing motor and is moveable when the group of lenses is driven by the focusing motor.

7. The display device according to claim 5, wherein the fixation bracket, the light collection lens and the group of lenses are arranged on the first surface of the array substrate, and the filter is arranged on the second surface of the array substrate.

8. A method for manufacturing the display device according to claim 1, comprising:
    arranging the lens assembly and the image sensor at the single-substrate area; and
    electrically connecting the image sensor with the display driving circuit.

9. The method according to claim 8, wherein the arranging the lens assembly and the image sensor at the single-substrate area comprises:
    arranging the lens assembly on the first surface of the array substrate, wherein an orthographic projection of the lens assembly onto the array substrate comprises or falls within the first region; and
    arranging the image sensor on the second surface of the array substrate, wherein the orthographic projection of the lens assembly onto the array substrate falls within or coincides with an orthographic projection of the image sensor onto the array substrate.

10. The method according to claim 8, wherein the trace is connected to the display driving circuit,
    electrically connecting the image sensor with the display driving circuit comprises:
    connecting the image sensor with the display driving circuit through the first, binding connection or the first solder-ball connection.

11. The method according to claim 8, wherein the electrically connecting the image sensor with the display driving circuit comprises:
    connecting the image sensor with the backlight-source driving circuit through the second binding connection or the second solder-ball connection, so that the image sensor is electrically connected to the display driving circuit.

* * * * *